US009472951B2

(12) United States Patent
Kuo et al.

(10) Patent No.: US 9,472,951 B2
(45) Date of Patent: Oct. 18, 2016

(54) ELECTROSTATIC DISCHARGE PROTECTION DEVICE AND INTEGRATED CIRCUIT USING SAME

(71) Applicant: Fitipower Integrated Technology, Inc., Hsinchu (TW)

(72) Inventors: Ching-Jung Kuo, Hsinchu (TW); Chih-Nan Cheng, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 99 days.

(21) Appl. No.: 14/460,706

(22) Filed: Aug. 15, 2014

(65) Prior Publication Data

US 2015/0049404 A1    Feb. 19, 2015

(30) Foreign Application Priority Data

Aug. 15, 2013  (TW) .............................. 102129227 A

(51) Int. Cl.
| | | |
|---|---|---|
| H02H 3/22 | (2006.01) | |
| H02H 9/04 | (2006.01) | |
| H02H 7/12 | (2006.01) | |
| H01L 27/02 | (2006.01) | |
| H02H 3/20 | (2006.01) | |

(52) U.S. Cl.
CPC ........... *H02H 9/046* (2013.01); *H02H 7/1213* (2013.01); *H01L 27/0248* (2013.01); *H02H 3/20* (2013.01); *H02H 9/04* (2013.01); *H02H 9/043* (2013.01)

(58) Field of Classification Search
USPC .................................................. 361/56, 111
See application file for complete search history.

(56) References Cited

U.S. PATENT DOCUMENTS

| | | | | |
|---|---|---|---|---|
| 6,057,726 A | * | 5/2000 | Sumida ................. | H03F 3/3001 326/68 |
| 6,775,112 B1 | | 8/2004 | Smith et al. | |
| 8,212,536 B2 | | 7/2012 | Burns et al. | |
| 2006/0126253 A1 | * | 6/2006 | Urakabe ................. | H02M 1/38 361/118 |
| 2008/0074816 A1 | * | 3/2008 | Omaru ................ | H01L 27/0248 361/56 |
| 2010/0157493 A1 | * | 6/2010 | Guedon .............. | H01L 27/0285 361/56 |
| 2010/0171473 A1 | * | 7/2010 | Kazama .................. | H02M 1/34 323/271 |
| 2011/0101947 A1 | | 5/2011 | Gajanana et al. | |
| 2013/0049654 A1 | * | 2/2013 | Kure ....................... | B60L 3/003 318/400.2 |

* cited by examiner

*Primary Examiner* — Danny Nguyen
(74) *Attorney, Agent, or Firm* — Zhigang Ma

(57) ABSTRACT

An electrostatic discharge (ESD) protection device is formed in an integrated circuit (IC) with a DC-DC converter. The DC-DC converter includes a high-side switch and a low-side switch in series. The ESD protection device includes a first ESD protection component coupled to the high-side switch in parallel and a second ESD protection component coupled to the low-side switch in parallel. When an ESD occurs, the first ESD protection component is turned on before the high-side switch functions and the second ESD protection component is turned on before the low-side switch functions.

14 Claims, 2 Drawing Sheets

ELECTROSTATIC DISCHARGE PROTECTION DEVICE AND INTEGRATED CIRCUIT USING SAME

CROSS-REFERENCE TO RELATED APPLICATIONS

This application claims priority to Taiwanese Patent Application No. 102129227 filed on Aug. 15, 2013 in the Taiwan Intellectual Property Office, the contents of which are incorporated by reference herein.

FIELD

The disclosure generally relates to an electrostatic discharge (ESD) protection device and an integrated circuit (IC) including the ESD protection device.

BACKGROUND

An integrated circuit (IC), such as a DC-DC converter, can include a high-side switch, a low-side switch, and an input/output (I/O) terminal arranged between the high-side switch and the low-side switch. The high-side switch and the low-side switch both may be metal oxide semiconductor (MOS) components. An electrostatic discharge (ESD) protection device is arranged on the I/O terminal. The ESD protection device is electrically coupled to the high-side switch or the low-side switch. The high-side switch or the low-side switch may turn on before the ESD protection device is able to function.

BRIEF DESCRIPTION OF THE DRAWINGS

Implementations of the present technology will now be described, by way of example only, with reference to the attached figures.

DETAILED DESCRIPTION

Figure 1:
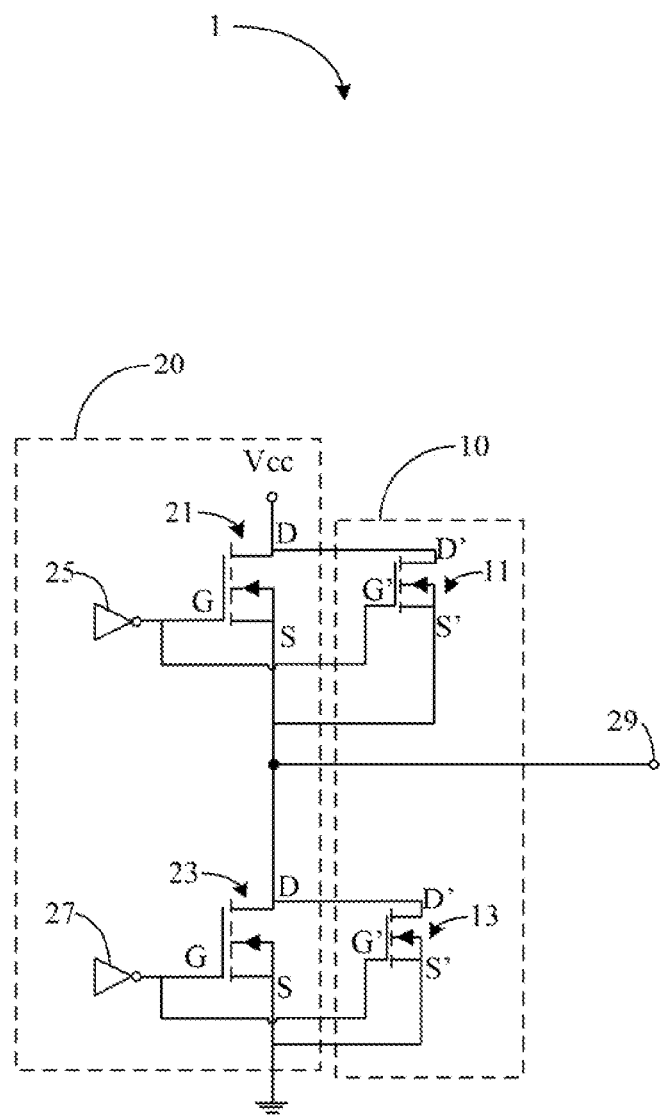
FIG. 1 is a circuit diagram of an electrostatic discharge (ESD) protection device utilized in an integrated circuit (IC) according to an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected.

Referring to FIG. 1, an integrated circuit (IC) 1 can include an electrostatic discharge (ESD) protection device 10 and a DC-DC converter 20. The DC-DC converter 20 can include a high-side switch 21, a low-side switch 23, a first pre-driver 25, a second pre-driver 27, and an output terminal 29. In the embodiment, the high-side switch 21 and the low-side switch 23 are both metal-oxide semiconductor (MOS) components. The high-side switch 21 and the low-side switch 23 can each include a gate "G", a source "S", and a drain "D."

The gate "G" of the high-side switch 21 is electrically coupled to the first pre-driver 25, the drain "D" of the high-side switch 21 is electrically coupled to a direct current source Vcc, and the source "S" of the high-side switch 21 is electrically coupled to the output terminal 29. The first pre-driver 25 can switch the high-side switch 21 on or off. The gate "G" of the low-side switch 23 is electrically coupled to the second pre-driver 27, the drain "D" of the low-side switch 23 is electrically coupled to the output terminal 29, and the source "S" of the low-side switch 23 is grounded. The second pre-driver 27 can switch the low-side switch 23 on or off. The first pre-driver 25 and the second pre-driver 27 cooperatively control the high-side switch 21 and the low-side switch 23 to alternately turn on.

In the embodiment, the high-side switch 21 and the low-side switch are both N-metal oxide semiconductor (NMOS) components.

The ESD protection device 10 can include a first ESD protection component 11 and a second ESD protection component 13. The first ESD protection component 11 and the second ESD protection component 13 are each a transistor, which includes a gate "G'", a source "S'", and a drain "D'." The first ESD protection component 11 is electrically coupled to the high-side switch 21 in parallel. The second protection component 13 is electrically coupled to the low-side switch 23. In the embodiment, the first ESD protection component 11 and the second ESD protection component 13 are fingers devices.

The gate "G'" of the first ESD protection component 11 is electrically coupled to the gate "G" of the high-side switch 21, the drain "D'" of the first ESD protection component 11 is electrically coupled to the DC source Vcc, and the source "S'" of the first ESD protection component 11 is electrically coupled to the source "S" of the high-side switch 21. The gate "G'" of the second ESD protection component 13 is electrically coupled to the gate "G" of the low-side switch 23, the drain "D'" of the second ESD protection component 13 is electrically coupled to the output terminal 29, and the source "S'" of the second ESD protection component 13 is grounded. In the embodiment, the first ESD protection component 11 and the second ESD protection component 13 are both N-metal oxide semiconductor (NMOS) components.

Figure 2:
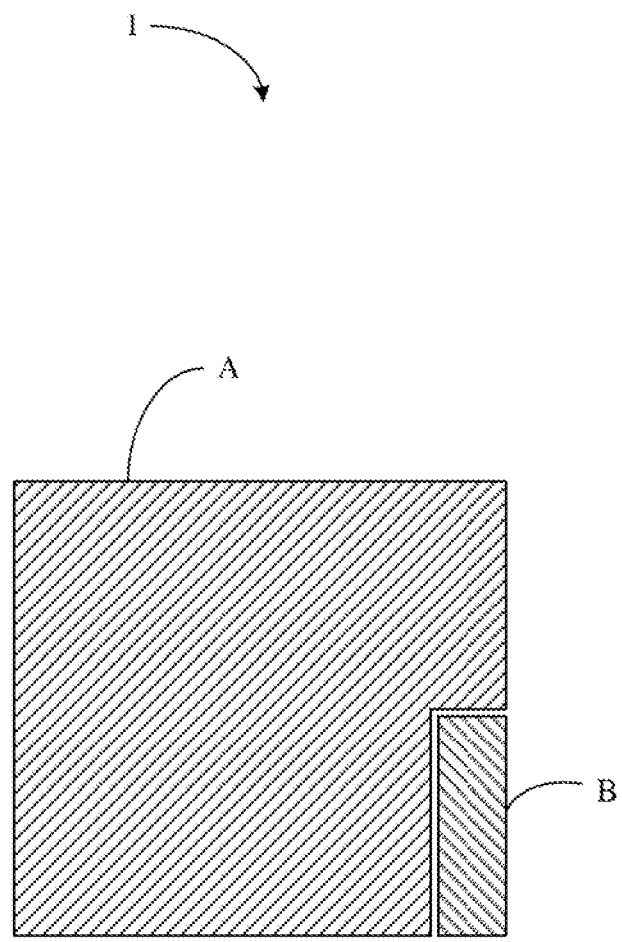
FIG. 2 is a block diagram of an IC including the ESD protection device of FIG. 1.

Referring to FIG. 2, the high-side switch 21 and the low-side switch 23 are arranged in a first area "A" of the IC 1 and the first ESD protection component 11 and the second ESD protection component 13 are arranged in a second area "B" of the IC 1. A size of the first area "A" is much larger than a size of the second area "B", thus a parasitic capacitance of the first ESD protection component 11 is less than a parasitic capacitor of the high-side switch 21 and a parasitic capacitor of the second ESD protection component 13 is less than a parasitic capacitor of the low-side switch 23. When an ESD occurs, the first ESD protection component 11 is turned on before the high-side switch 21 and the second ESD protection component 13 is also turned on, the ESD is discharged to ground through the first ESD protection component 11 and the second ESD protection component 13. The ESD protection device 10 has a DC converting function similar to that of the DC-DC converter 20, thus an efficiency of the IC is improved.

It is to be understood that even though numerous characteristics and advantages of the present embodiments have been set forth in the foregoing description, with details of the structures and functions of the embodiments, the disclosure is illustrative only. Changes may be made in detail, especially in the matter of arrangement of parts within the principles of the embodiments, to the full extent indicated by the broad general meaning of the terms in which the appended claims are expressed.

What is claimed is:

1. An electrostatic discharge (ESD) protection device for an integrated circuit (IC) with a DC-DC converter comprising a high-side switch and a low-side switch coupled in series to the high-side switch,
the ESD protection device comprising:
a first ESD protection component having a gate electrically coupled to a gate of the high-side switch; and
a second ESD protection component having a gate electrically coupled to a gate of the low-side switch;
wherein the first ESD protection component is turned on before the high-side switch is able to function and the second ESD protection component is turned on before the low-side switch is able to function;
wherein a parasitic capacitor of the first ESD protection component is less than a parasitic capacitor of the high-side switch and a parasitic capacitor of the second ESD protection component is less than a parasitic capacitor of the low-side switch.

2. The ESD protection device of claim 1, wherein the first ESD protection component is electrically coupled to the high-side switch in parallel; the second ESD protection component is electrically coupled to the low-side switch in parallel.

3. The ESD protection device of claim 2, wherein the first ESD protection component further comprises a drain electrically coupled to a direct current (DC) source and a source electrically coupled to a source of the high-side switch; and the second ESD protection component further comprises a drain electrically coupled to a drain of the low-side switch and a source which is grounded.

4. The ESD protection device of claim 1, wherein the first ESD protection component and the second ESD protection component are both N-metal oxide semiconductor (NMOS) components.

5. The ESD protection device of claim 1, wherein the gate of the high-side switch is electrically coupled to a first pre-driver, the gate of the low-side switch is electrically coupled to a second pre-driver, and the first pre-driver and the second pre-driver alternately turn on the high-side switch and the low-side switch.

6. The ESD protection device of claim 5, wherein the gate of the first ESD protection component and the gate of the high-side switch are electrically coupled to the first pre-driver; the gate of the second ESD protection component and the gate of the low-side switch are electrically coupled to the second pre-driver.

7. An integrated circuit, comprising:
a DC-DC converter comprising:
a high-side switch;
a low-side switch coupled to the high-side switch; and
an output terminal between the high-side switch and the low-side switch; and
an electrostatic discharge (ESD) protection device comprising:
a first ESD protection device coupled to the high-side switch in parallel; and
a second ESD protection device coupled to the low-side switch in parallel;
wherein a parasitic capacitor of the first ESD protection component is less than a parasitic capacitance of the high-side switch and a parasitic capacitance of the second ESD protection component is less than a parasitic capacitor of the low-side switch.

8. The integrated circuit of claim 7, wherein when an ESD occurs, the first ESD protection component is turned on before the high-side switch and the second ESD protection component is turned on before the low-side switch.

9. The ESD protection device of claim 7, wherein the first ESD protection component is electrically coupled to the high-side switch in parallel; the second ESD protection component is electrically coupled to the low-side switch in parallel.

10. The ESD protection device of claim 9, wherein the gate of the first ESD protection component is electrically coupled to the gate of the high-side switch, a drain of the first ESD protection component is electrically coupled to a DC source, and a source of the first ESD protection component is electrically coupled to a source of the high-side switch; and the gate of the second ESD protection component is electrically coupled to the gate of the low-side switch, a drain of the second ESD protection component is electrically coupled to a drain of the low-side switch, and a source of the second ESD protection component is grounded.

11. The ESD protection device of claim 7, wherein the first ESD protection component and the second ESD protection component are both N-metal oxide semiconductor (NMOS) components.

12. The ESD protection device of claim 7, wherein the gate of the high-side switch is electrically coupled to a first pre-driver, the gate of the low-side switch is electrically coupled to a second pre-driver, and the first pre-driver and the second pre-driver alternately turn on the high-side switch and the low-side switch.

13. The ESD protection device of claim 12, wherein the gate of the first ESD protection component and the gate of the high-side switch are electrically coupled to the first pre-driver; the gate of the second ESD protection component and the gate of the low-side switch are electrically coupled to the second pre-driver.

14. The ESD protection device of claim 7, wherein the high-side switch and the low-side switch are arranged in a first area of the integrated circuit and the first ESD protection component and the second ESD protection component are arranged in a second area of the integrated circuit, and a size of the first area is much larger than a size of the second area.

* * * * *